(12) United States Patent
Wachter et al.

(10) Patent No.: US 12,262,494 B2
(45) Date of Patent: Mar. 25, 2025

(54) ELECTRICAL APPARATUS HAVING ONE OR MORE SENSORS ON POWER-CONDUCTING AND/OR POWER-SWITCHING ELEMENTS AROUND WHICH A FLUID FLOWS

(71) Applicant: Dr. Ing. h.c. F. Porsche Aktiengesellschaft, Stuttgart (DE)

(72) Inventors: Sebastian Wachter, Pressig (DE); Patrick Fuchs, Leonberg (DE)

(73) Assignee: DR. ING. H.C. F. PORSCHE AKTIENGESELLSCHAFT, Stuttgart (DE)

(*) Notice: Subject to any disclaimer, the term of this patent is extended or adjusted under 35 U.S.C. 154(b) by 8 days.

(21) Appl. No.: 18/484,459

(22) Filed: Oct. 11, 2023

(65) Prior Publication Data

US 2024/0130062 A1  Apr. 18, 2024

(30) Foreign Application Priority Data

Oct. 18, 2022 (DE) ..................... 10 2022 127 337.7

(51) Int. Cl.
*H05K 5/06* (2006.01)
*H02M 1/00* (2006.01)
(Continued)

(52) U.S. Cl.
CPC ........ *H05K 5/0247* (2013.01); *H02M 1/0009* (2021.05); *H05K 5/061* (2013.01);
(Continued)

(58) Field of Classification Search
CPC .............................. H05K 5/061; H05K 5/067
See application file for complete search history.

(56) References Cited

U.S. PATENT DOCUMENTS

| 2013/0215573 A1* | 8/2013 | Wagner | G06Q 30/0629 361/702 |
| 2018/0017462 A1* | 1/2018 | Kube | G01M 3/186 |

(Continued)

FOREIGN PATENT DOCUMENTS

| DE | 102021121444 B3 | 10/2022 |
| DE | 102022115429 A1 | 12/2023 |
| WO | 2013015371 A1 | 1/2013 |

*Primary Examiner* — Hung V Ngo
(74) *Attorney, Agent, or Firm* — LEYDIG, VOIT & MAYER, LTD.

(57) ABSTRACT

An electrical apparatus, including a first housing having a fluid-filled or fluid-perfused wet space and a dry space that are separated from one another by a wall, wherein the wall includes an opening, one or more power-conducting and/or power-switching elements arranged in the wet space, and a control electronics for the one or more power-switching elements arranged in the dry space. The electrical apparatus includes a second housing extending from the opening into the wet space, wherein the second housing reaches up to or encloses a power-conducting element, and a sensor arranged in the second housing, the sensor being configured to measure a variable that depends on an electrical power flowing through the power-conducting element. The second housing seals the opening in the wall in a fluid-tight manner. Measured values or signals of the sensor conducted by lines are passed through the opening into the dry space.

12 Claims, 3 Drawing Sheets

(51) Int. Cl.
　　　*H05K 5/02*　　　(2006.01)
　　　*H02M 1/32*　　　(2007.01)

(52) U.S. Cl.
　　　CPC ............. *H05K 5/065* (2013.01); *H05K 5/067*
　　　　　　(2013.01); *H05K 5/069* (2013.01); *H02M 1/32*
　　　　　　　　　　　　　　　　　　　　　　(2013.01)

(56) References Cited

U.S. PATENT DOCUMENTS

| | | |
|---|---|---|
| 2019/0320549 A1 | 10/2019 | Song et al. |
| 2022/0140724 A1* | 5/2022 | Kohr .................... H05K 7/1432 |
| 2023/0057989 A1 | 2/2023 | Heusler et al. |
| 2023/0059583 A1 | 2/2023 | Fuchs et al. |
| 2023/0164963 A1 | 5/2023 | Barkow et al. |
| 2023/0246515 A1* | 8/2023 | Carstens ................ H02K 11/33 310/71 |
| 2023/0422434 A1 | 12/2023 | Barkow et al. |

* cited by examiner

ELECTRICAL APPARATUS HAVING ONE OR MORE SENSORS ON POWER-CONDUCTING AND/OR POWER-SWITCHING ELEMENTS AROUND WHICH A FLUID FLOWS

CROSS REFERENCE TO RELATED APPLICATIONS

This application claims benefit to German Patent Application No. DE 10 2022 127 337.7, filed on Oct. 18, 2022, which is hereby incorporated by reference herein.

FIELD

The present invention relates to an electrical apparatus, for example, of a motor vehicle, in particular a measuring arrangement for a power electronics around which a fluid flows, e.g. for controlling electric drives.

BACKGROUND

Electric drive motors of vehicles often have power outputs in the three-digit kW range. This electrical power must be supplied to the drive motors in a suitable manner; in particular, the power must be adjustable between a minimum value and the maximum value, ideally continuously variable, or at least adjustable in as few steps as possible.

The power supplied to the drive motor, e.g. in order to set a desired speed and/or desired torque, is provided by a corresponding control circuit. In many vehicles, self-excited or externally excited synchronous or asynchronous machines are used, i.e. electric motors configured so as to operate with alternating currents. However, the electrical energy storage unit in electric or hybrid vehicles is almost always an electrochemical energy storage unit that provides a DC voltage. Accordingly, the control circuit generally comprises an inverter, which converts the DC voltage into an AC voltage at the frequency required for a desired speed and the amplitude required for a required power.

In order to switch the DC voltage to an AC voltage, semi-conductor switches are switched in rapid succession between a conductive and a non-conductive state. In these switching operations, energy is lost each time in the form of heat that needs to be appropriately dissipated in order to safely prevent a temperature increase above a maximum allowable operating temperature of the semiconductor switches. Because high currents always flow at high power levels, the electrical lines must be sized accordingly. So-called power buses, i.e. rigid conductors made of copper or aluminum, having a sufficiently large cross-section, are frequently used here within the control circuits. These power buses can simultaneously dissipate a portion of the heat losses generated during operation of the semiconductor switches.

In order to obtain an efficient cooling in a small space, the power electronics are often arranged in a housing flooded with or perfused by an electrically non-conductive fluid. Oils have been used here, in particular, and have been used in power system transformers for cooling purposes for many decades.

Because the cooling medium also at least partially flows around the power-conducting components, sensors provided on power-conducting or power-switching elements for measuring electrical power of dependent quantities, e.g. current sensors, temperature sensors, and the like, are sealed against direct contact with the coolant. However, even a casting of the sensor with a resin cannot always reliably prevent the penetration of the cooling medium into the interior of the sensor, due to the different materials with their different properties.

SUMMARY

In an embodiment, the present disclosure provides an electrical apparatus, comprising a first housing having a fluid-filled or fluid-perfused wet space and a dry space that are separated from one another by a wall, wherein the wall comprises an opening, one or more power-conducting and/or power-switching elements arranged in the wet space, and a control electronics for the one or more power-switching elements arranged in the dry space. The electrical apparatus further comprises a second housing extending from the opening into the wet space, wherein the second housing reaches up to or encloses a power-conducting element, and a sensor arranged in the second housing, the sensor being configured to measure a variable that depends on an electrical power flowing through the power-conducting element. The second housing seals the opening in the wall in a fluid-tight manner. Measured values or measured signals of the sensor conducted by lines are passed through the opening in the wall into the dry space.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
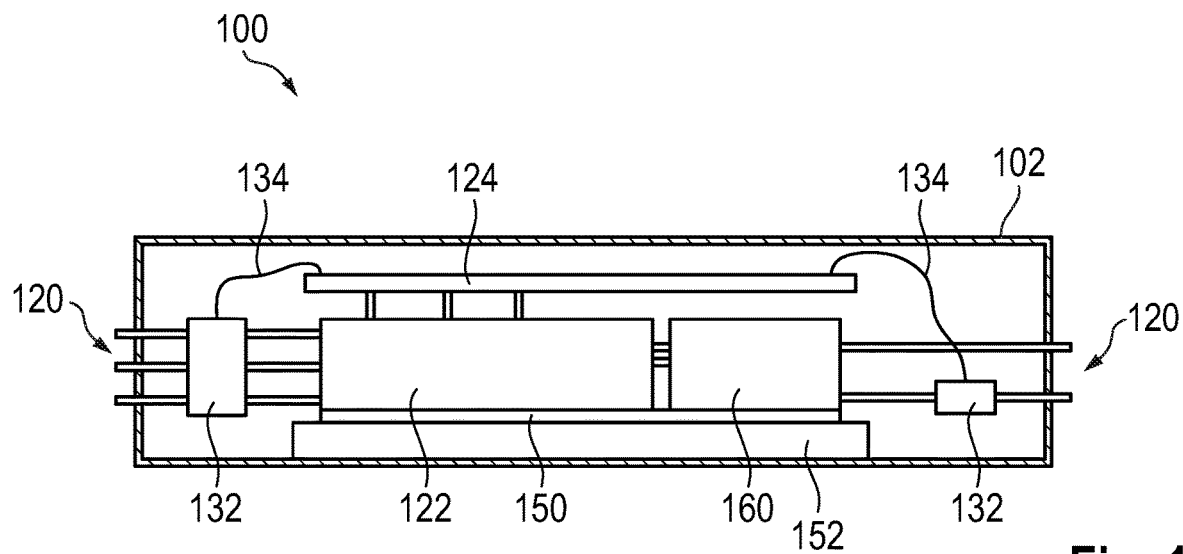
FIG. 1 shows a schematic illustration of an electrical apparatus known from the prior art, with one or more sensors on power-conducting elements.

In an embodiment, the present invention provides an electrical apparatus having one or more sensors on power-conducting or power-switching elements around which a fluid flows, which reliably prevents contact of the one or more sensors with the fluid.

The electrical apparatus according to an embodiment of the present invention has a first housing comprising a fluid-filled or fluid-perfused wet space and a dry space. The wet and dry spaces are separated from one another by a wall. The fluid is electrically non-conductive. One or more power-conducting and/or power-switching elements are arranged in the wet space. A control electronics for the power-switching elements is arranged in the dry space. According to an embodiment of the invention, the wall comprises an opening out of which a second housing extends into the wet space. The second housing extends up to or encloses a power-conducting element. A sensor is arranged in the second housing, which sensor is configured so as to measure a variable that depends on an electrical power flowing through the power-conducting element, for example for measuring an electrical current through one or more lines, a temperature, or a magnetic field. The second housing seals the opening in the wall in a fluid-tight manner. Lines conducting measured values or measured signals of the sensor are passed through the opening in the wall into the dry space.

In one or more configurations of the electrical apparatus according to an embodiment of the invention, a seal is provided between the second housing and the wall. The seal can consist of a suitable elastic sealant. The second housing can be connected to the wall such that a surface of the second housing adjoining the sealing means pushes it against the wall so that the fluid seal is produced. For example, the second housing can comprise an edge that runs circumferentially around the opening in the wall and can be fixed to the wall or edge of the opening by means of screws, clips, detent connections, or the like.

In one or more configurations of the electrical apparatus according to an embodiment of the invention, the second housing is open towards the dry space in the region of the opening in the wall. In this case, an internal space of the second housing is directly connected to the dry space, so that lines from the second housing can be fed into the dry space through the opening in the wall.

However, the second housing can also be closed towards the dry space. In this case, lines conducting measured values or measured signals of the sensor can be passed into the dry space through cable feedthroughs or electrical plug connections in an outer wall of the second housing located above the opening.

Alternatively, the second housing can be filled with an electrically insulating casting compound, and lines conducting measured values or measured signals of the sensor can be passed from out of the casting compound through the opening in the wall of the first housing.

In one or more configurations of the electrical apparatus according to embodiments of the invention, the second housing is configured so as to fix the power-conducting element(s), up to which the second housing reaches or which it encloses, in the wet space.

The electrical apparatus according to an embodiment of the present invention can advantageously prevent electrical sensor contacts from being wetted by the electrically non-conductive fluid, leading to measured values being distorted or no longer reaching the control circuitry. In addition, flexible lines are no longer required within the wet space, so that material compatibility with the fluid in terms of its insulation is uncritical, and there is also no longer a risk that the fluid will enter the dry space due to the capillary effect within the insulation.

A method for assembling the electrical apparatus according to an embodiment of the present invention first comprises providing the first housing, the power-conducting and power-switching elements, the control electronics, and the second housing with the sensor arranged therein. The second housing is first arranged on at least one or around at least one of the power-conducting elements before the at least one power-conducting element is connected to the at least one power-switching element. The elements thus connected can now be positioned in the wet space of the first housing. Alternatively, in a further alternative, the at least one power-conducting element can first be connected to the at least one power-shifting element, before the second housing is arranged on at least one or around at least one of the power-conducting elements and the elements are positioned in the wet space of the first housing. In a further alternative, the at least one power-conducting element can first be connected to the at least one power-shifting element, before the elements are positioned in the wet space of the first housing and the second housing is finally arranged on at least one or around at least one of the power-conducting elements. If the second housing is already arranged on or around the power-conducting element when the elements are provided, the corresponding step of arranging is logically omitted.

The positioned elements are now fixed in place in the first housing and the opening in the wall is fluid-tightly sealed by means of the second housing. The control electronics can now be placed in the dry space of the second housing and connected to lines conducting measured values or measured signals of the sensor.

The electrical apparatus according to an embodiment of the invention is particularly advantageously applicable in electric or hybrid vehicles.

In the following, embodiments of the invention are described by way of an example based on the figures.

In the figures, the same or similar elements can be referenced by the same reference numbers.

FIG. 1 shows a schematic representation an electrical apparatus 100 from the prior art having one or more sensors 132 on power-conducting elements 120. For example, the electrical apparatus forms a pulse inverter with a power module 122 comprising one or more power-switching elements. The power module 122 is coupled to a cooling element 152 by means of a suitable thermal bonding 150, which can be part of a housing 102, for example, or a fluid-perfused cooling element. Here, the power-conducting elements 120 are a three-phase AC power connector, shown on the left side of the apparatus 100, and a DC power connector, shown on the right side of the apparatus. It should be noted that applications with fewer or more phases are also contemplated. For example, in an electrical apparatus for driving an asynchronous or synchronous motor of an electric or hybrid vehicle, the AC power connector represents the output of the apparatus, while the DC power connector draws power from a battery. In the recuperation operation of the vehicle, the power flow is reversed, so that power flows from the motor, now operating as a generator, to the DC power connector and ultimately into the battery. A conductor of the DC power connector is provided with a sensor 132 that measures the current flowing from the battery into the electrical apparatus. The sensor 132 is connected to a control electronics 124 by means of a line 134. The power module 122 is connected to the DC power connector via a DC power connector 160. The power module 122 is controlled via control lines from the control electronics 124 in order to deliver a suitable three-phase AC current to the AC power connector. A current sensor 132 is provided in order to monitor proper function and precise control, which is shown here as a combined three-phase measurement assembly. It should be noted that individual sensors can also be used for each phase. This sensor is also connected to the control electronics 124 by means of a line 134. In the known electrical apparatus, the cooling of the power module 122 is only possible from one side, which limits its maximum power.

Figure 2:
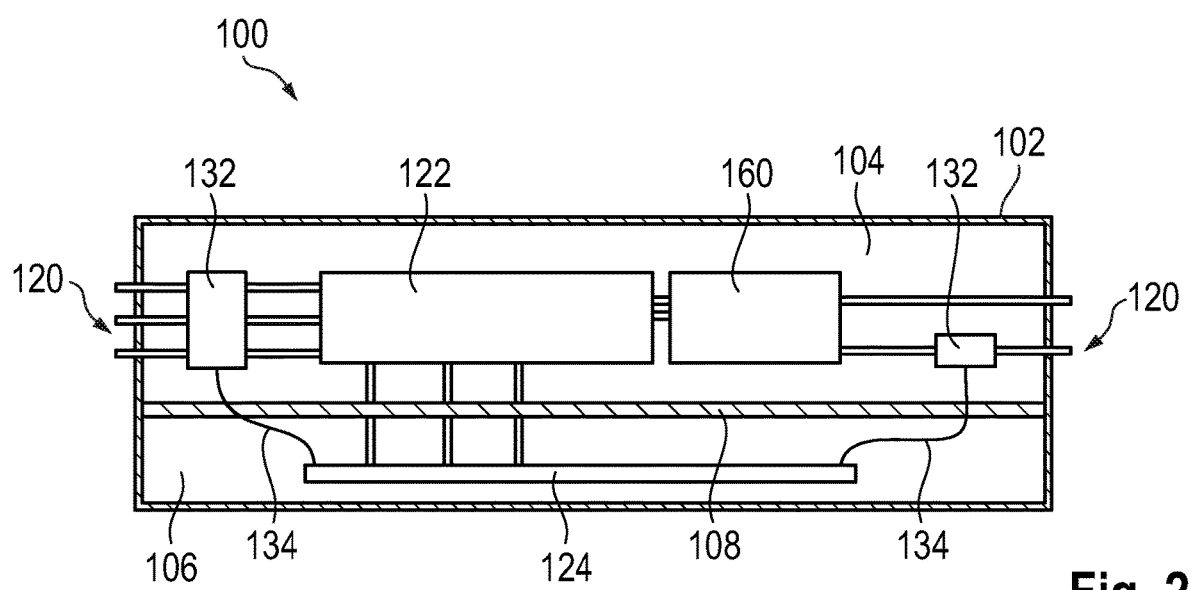
FIG. 2 shows a schematic illustration of an electrical apparatus known from the prior art, with one or more sensors on power-conducting elements around which a fluid flows.

FIG. 2 shows a schematic representation of an electrical apparatus 100 from the prior art, having one or more sensors 132 on power-conducting elements 120 around which a fluid flows. Here, as well, the electrical apparatus forms, for example, a pulse inverter with a power module 122 comprising one or more power-switching elements. Here, the power-conducting elements 120 are also a three-phase AC power connector, shown on the left side of the apparatus 100, and a DC power connector, shown on the right side of the apparatus. Also in this figure, for example, in an electrical apparatus for driving an asynchronous or synchronous motor of an electric or hybrid vehicle, the AC power connector represents the output of the apparatus, while the DC power connector draws power from a battery. In contrast to the electrical apparatus shown in FIG. 1, the housing 102 is divided by a wall 108 into a wet space 104 and a dry space 106. The power-conducting elements 120 and the power module 122 are arranged in the wet space 104, which is perfused by a cooling fluid, such as an electrically non-conductive oil. Thus, the heat generated in the power module 122 and the power-conducting elements 120 can be more readily received and discharged elsewhere.

A conductor of the DC power connector is equipped with a sensor 132, which measures the current flowing from the battery into the electrical apparatus, or vice versa. The sensor 132 is connected to a control electronics 124 arranged in the dry space 106 by means of a line 134. The line 134 must be passed through the wall 108, which on the one hand requires a further opening in the wall, which must be sealed in a fluid-tight manner, and on the other hand the line must be connected to the sensor 132 so that no cooling fluid can penetrate into the sensor 132 and also cannot get out of the wet space via the line 134.

The power module 122 is connected to the DC power connector via a DC power connector 160. The power module 122 is controlled via control lines from the control electronics 124 in order to deliver a suitable three-phase AC current to the AC power connector. A current sensor 132 is provided in order to monitor proper function and precise control, which is shown here as a combined three-phase measurement assembly. As already noted with reference to FIG. 1, individual sensors can also be utilized for each phase. This sensor is also connected to the control electronics 124 by means of a line 134. Here, as well, the sensor 132 must be protected from the ingress of the cooling fluid, and the cooling fluid cannot leak out of the wet space 104 along the insulation of the line. Particularly in the case of flexible lines 134, the production of the fluid-tightness can be difficult.

Figure 3:
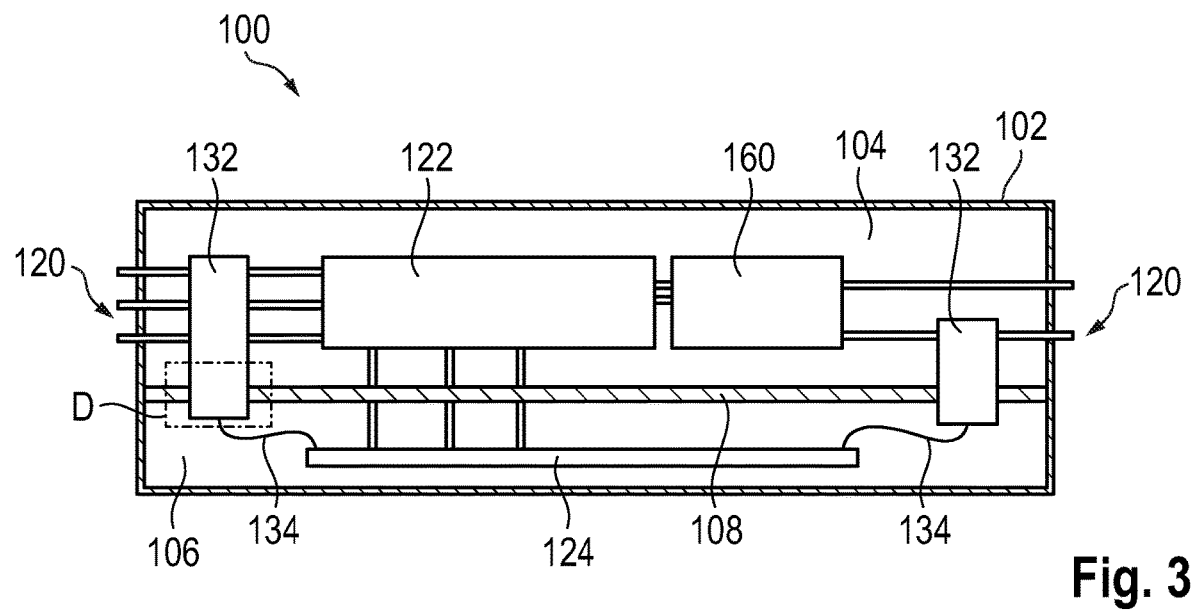
FIG. 3 shows a schematic illustration of an electrical apparatus according to an embodiment of the invention, with one or more sensors on power-conducting elements through which a fluid flows.

FIG. 3 shows a schematic illustration of an electrical apparatus 100 according to an embodiment of the invention, with one or more sensors 132 on power-conducting elements 120 through which a fluid flows. The elements and their respective functions, as well as their arrangement in relation to one another, correspond to those described with reference to FIG. 2. By contrast to the electrical apparatus 100 of FIG. 2, the sensors 132 or their housings are passed through openings in the wall 108, such that the lines leading from the sensors 132 to the control electronics 134 are first passed out of the housings of the sensors 132 in the dry space 106. Thus, the cooling fluid cannot come into contact with the lines 134. The housings of the sensors are passed up until or enclose the power-conducting elements 120, but are designed to be fully fluid-tight against the wet space. An embodiment of the invention is explained in further detail in FIG. 4 with reference to the detail section indicated with D.

Figure 4:
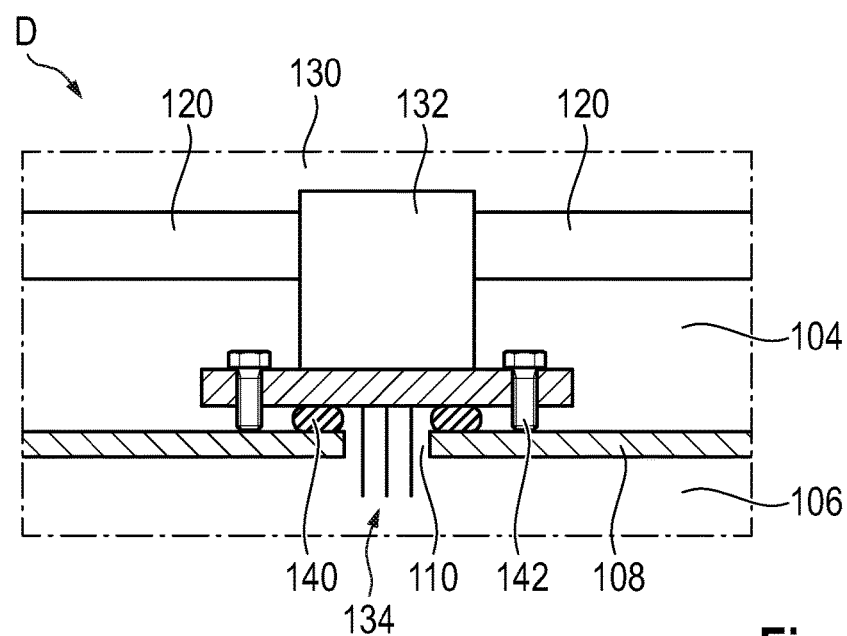
FIG. 4 illustrates a detail of the electrical apparatus according to an embodiment of the invention from FIG. 3.

FIG. 4 shows a detail D of the electrical apparatus 100 according to an embodiment of the invention from FIG. 3. In the figure, only the wall 108 can be seen from the housing 102, which separates the wet space 104 from the dry space 106. An opening 110 is provided in the wall, via which the sensor 132 is arranged in its housing 130 on the wet space side. The housing 130 completely covers the opening 110 and seals the wet space 104 against the dry space 106 by means of a seal 140. The housing 130 of the sensor 132 can be fixed, for example, by means of bolts 142. A power-conducting element 120 is passed through the housing 130 of the sensor 132. Here, the housing 130 of the sensor 132 is completely closed against the wet space. The power-conducting element 120 can also be fixed to the wall 108 by way of the housing 130 of the sensor 132. The lines 134 of the sensor exit the housing 130 of the sensor in the region of the opening 110 and lie directly in the dry space 106 so that no cooling fluid can penetrate into the housing 130 of the sensor 132 at the contact points.

Figure 5:
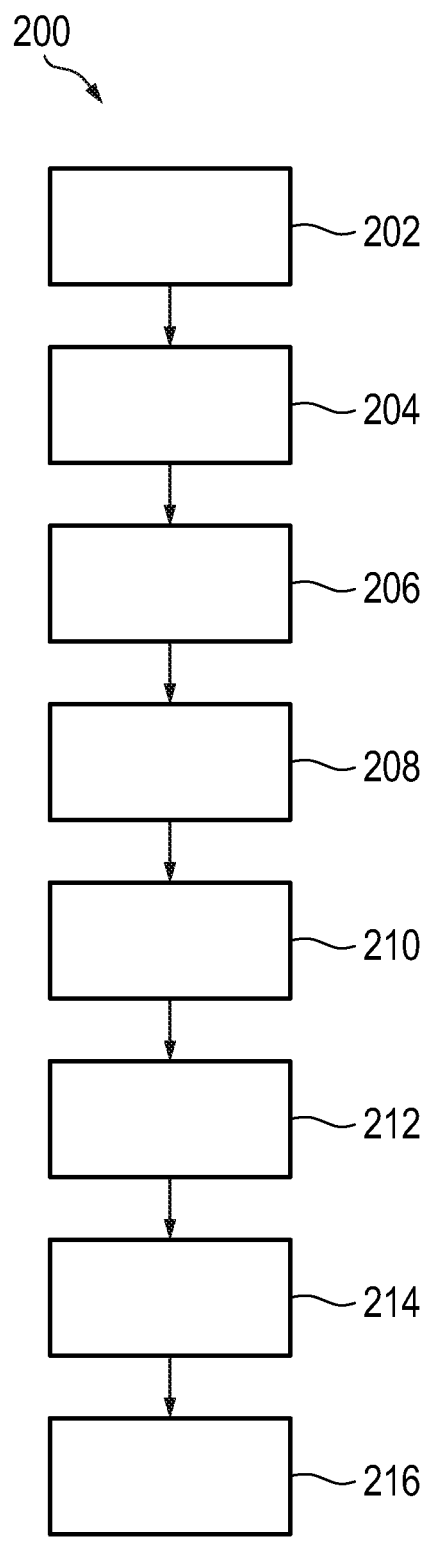
FIG. 5 illustrates a flow chart of an exemplary method for assembling an electrical apparatus according to an embodiment of the present invention.

FIG. 5 shows a flow chart of an exemplary method 200 for assembling an electrical apparatus 100 according to an embodiment of the invention. In step 202, the first housing 102, the power-conducting and power-switching elements 120, 122, the control electronics 124, and the second housing 130 are provided with the sensor 132 arranged therein. In step 204, the second housing 130 is arranged on at least one or around at least one of the power-conducting elements 120. Then, in step 206, the at least one power-conducting element 120 is connected to the at least one power-switching element 122, and, in step 208, the connected elements are positioned in the wet space 104 of the first housing 102 such that the second housing 130 comes to rest in or over the opening 110 in the wall 108. Then, in step 210, the at least one power-conducting 120 and power-switching 122 element is fixed in the first housing. During this, or thereafter, the opening 110 is fluidly sealed in step 212. In step 214, the control electronics 124 are arranged in the dry space 106 of the first housing 102, and, in step 216, lines 134 conducting the measured values or measured signals of the sensor 132 are connected to the control electronics 124.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

100 Apparatus
102 First housing
104 Wet space
106 Dry space
108 Wall
110 Opening
120 Power-conducting element
122 Power-switching element/power module
124 Control electronics
130 Second housing
132 Sensor
134 Line
140 Seal
142 Screw
150 Thermal bonding
152 Cooling element
160 Intermediate circuit capacitor
200 Method
202 Providing
204 Arranging
206 Connecting
208 Positioning
210 Fixing
212 Closing
214 Arranging
216 Joining

The invention claimed is:

1. An electrical apparatus, comprising:
a first housing having a fluid-filled or fluid-perfused wet space and a dry space that are separated from one another by a wall, wherein the wall comprises an opening;
one or more power-conducting and/or power-switching elements arranged in the wet space;
a control electronics for the one or more power-switching elements arranged in the dry space;
a second housing extending from the opening into the wet space, wherein the second housing reaches up to or encloses a power-conducting element; and
a sensor arranged in the second housing, the sensor being configured to measure a variable that depends on an electrical power flowing through the power-conducting element,
wherein the second housing seals the opening in the wall in a fluid-tight manner; and
wherein measured values or measured signals of the sensor conducted by lines are passed through the opening in the wall into the dry space.

2. The electrical apparatus according to claim 1, wherein a seal is provided between the second housing and the wall.

3. The electrical apparatus according to claim 1, wherein the second housing is open towards the dry space in a region of the opening in the wall.

4. The electrical apparatus according to claim 1, wherein the second housing is filled with an electrically insulating casting compound.

5. The electrical apparatus according to claim 1, wherein the second housing is configured to fix the one or more power-conducting elements, up to which the second housing reaches or which it encloses, in the wet space.

6. The electrical apparatus according to claim 1, wherein the sensor arranged in the second housing is configured to measure an electrical current, a temperature, or a magnetic field.

7. An electric or hybrid vehicle having the electrical apparatus according to claim 1.

8. A method for assembling the electrical apparatus according to claim 1, comprising the following steps:
a) providing the first housing, the one or more power-conducting and power-switching elements, the control electronics, and the second housing with the sensor arranged therein;
b) arranging the second housing on at least one or around at least one of the one or more power-conducting elements;
c) connecting the at least one power-conducting element to at least one of the one or more power-switching elements;
d) positioning the at least one power-conducting and power-switching element in the wet space of the first housing such that the second housing comes to rest in or over the opening in the wall;
e) fixing the at least one power-conducting and power-switching element in the first housing, and fluid-tightly closing the opening with the second housing;
f) arranging the control electronics in the dry space of the first housing; and
g) connecting lines that conduct the measured values or measured signals of the sensor to the control electronics.

9. The method according to claim 8, wherein the steps b), c), and d) are performed in alphabetic order.

10. The method according to claim 8, wherein step b) is performed before step a).

11. The method according to claim 8, wherein the steps b), c), and d) are performed in an order c), b), d).

12. The method according to claim 8, wherein the steps b), c), and d) are performed in an order c), d), b).

* * * * *